United States Patent [19]
Johnson et al.

[11] Patent Number: 5,930,165
[45] Date of Patent: Jul. 27, 1999

[54] FRINGE FIELD SUPERCONDUCTING SYSTEM

[75] Inventors: Mark B. Johnson, Springfield, Va.; Thomas W. Clinton, Bethesda, Md.

[73] Assignee: The United States of America as represented by the Secretary of the Navy, Washington, D.C.

[21] Appl. No.: 08/962,454

[22] Filed: Oct. 31, 1997

[51] Int. Cl.$^6$ .................................................. G11C 11/44
[52] U.S. Cl. .................. 365/171; 365/174; 365/160; 365/161; 365/162
[58] Field of Search .................................. 365/171, 174, 365/160, 161, 162

[56] References Cited

U.S. PATENT DOCUMENTS

| | | | |
|---|---|---|---|
| 4,334,158 | 6/1982 | Faris | 307/462 |
| 5,011,817 | 4/1991 | Hidaka et al. | 365/162 |
| 5,039,656 | 8/1991 | Hidaka | 365/161 |
| 5,041,880 | 8/1991 | Nojima et al. | 357/5 |
| 5,247,475 | 9/1993 | Hasunuma | 365/162 |
| 5,276,639 | 1/1994 | Inoue | 365/160 |
| 5,311,036 | 5/1994 | Nishino et al. | 257/30 |
| 5,311,037 | 5/1994 | Harada et al. | 257/34 |
| 5,553,036 | 9/1996 | Takemura | 369/13 |
| 5,596,206 | 1/1997 | Yamazaki | 257/30 |
| 5,831,278 | 11/1998 | Berkowitz | 257/31 |

OTHER PUBLICATIONS

Dolan et al., "Properties of Superconducting Weak Links Formed by Magnetically Weakening a Short Length of a Uniform Aluminum Film", *IEEE Transactions on Magnetics* vol. MAG–13 No. 1, 581–84 (Jan. 1977).

Matisoo, "The Superconducting Computer", *Sci. Am.* May 1980, 50–65.

*Primary Examiner*—Vu A. Le
*Attorney, Agent, or Firm*—Thomas E. McDonnell; John J. Karasek

[57] ABSTRACT

The instant invention is a switch, comprising: (1) a pathway of a superconductive material; and (2) a ferromagnet, where the ferromagnet is adapted for having at least a first magnetization state and a second magnetization state, where fringe fields from the ferromagnet in the first magnetization state do not exceed a predetermined magnetic field in the superconductive pathway to convert at least a portion of the superconductive pathway to the normal state; where fringe fields from the ferromagnet in the second magnetization state exceed the predetermined magnetic field in the superconductive pathway to convert at least a portion of the superconductive pathway to the normal state.

27 Claims, 12 Drawing Sheets

FRINGE FIELD SUPERCONDUCTING SYSTEM

BACKGROUND OF THE INVENTION

1. Field of the Invention

The present invention relates to superconducting switches, including both power and logic switches. More particularly, the invention relates to superconducting switches using fringe magnetic fields to set and/or change the switches from the normal (metallic) state to the superconducting state.

2. Description of the Related Art

Three- and four-terminal superconducting switches have been desired since at least the early 1980's. See generally Matisoo, "The Superconducting Computer", Scientific American, May 1980, 50–65, incorporated by reference herein, in its entirety for all purposes. Features that would be desired for an optimal superconducting switch include: (a) availability of a non-latching mode of operation, (b) volatile and non-volatile modes (i.e., keeps it state after the removal of a bias current) available, (c) reliability and stability in operational parameters over time, (d) simplicity of fabrication by standard lithographic techniques, without the need for extremely well controlled processes (as is required by the fabrication of Josephson junctions), (e) high gain, (f) broad operational range, and (g) fast response time.

A number of known superconducting switches have at least a few of these desirable properties. However, it is not believed that any known superconducting switch has all of these desirable properties.

Many known superconducting devices rely on conventional Josephson junctions. Josephson junctions rely on a "weak link", through which supercurrents may tunnel. As skilled practitioners will recognize, a weak link is a structure that does not in itself have superconducting properties, but will allow a relatively small flow of tunnel current. Because they rely on this tunneling effect, and since tunneling currents are typically short range and can vary greatly with small changes in features sizes, traditional Josephson junctions are typically very finely featured and require very precise fabrication. Moreover, even small, localized changes in the chemistry of a Josephson junction over time (through diffusion or reaction) may produce very large changes in the properties of the junction. Thus, the operating parameters of conventional Josephson junctions tend to drift over time. This shortcoming of Josephson junctions could be overcome if the parameters of a Josephson junction could be tuned, to keep it within an operational range.

Some examples of known superconducting switches using Josephson junctions are set forth below.

The Controlled Weak Link, or CLINK, is described in Wong et al., Phys. Rev. Lett. 35 150 (1976). The CLINK state changes are slow, due to being governed by thermal relaxation times. Moreover, the CLINK latches. That is, once the CLINK switches to the normal state, resistive heating will keep the device above the critical temperature, and thus in the normal state. The CLINK will reset only when the bias current is removed, and the device gradually cools back down to below the critical temperature.

The QUITERON, which uses stacked Josephson junctions and relies on the Quasiparticle Injection Tunneling Effect, is described in Faris et al., IEEE Trans. Mag., MAG-19, 1290 (1983). QUITERONs typically have lower gains than CLINKs.

Another device is disclosed in Matisoo, supra. Referring to FIG. 1, the device 10 is similar to the QUITERON, but a thick, electrically insulating layer separates the superconducting striplines S1 and S2 and the Josephson junction from a two terminal wire that runs parallel with S1 and S2 over a segment of finite length and through which the control current is applied. In this case, no control current is tunneled into S1 nor S2 and there is no population of non-equilibrium quasi-particles. Rather, the control current $I_w$ generates a magnetic field (depicted by the field lines in FIG. 1) in the junction region and, in particular, in the Josephson junction tunnel barrier. The magnetic field depresses the critical current of the Josephson junction in a manner described in detail in Matisoo.

The device functions using a bias current of magnitude less than the junction critical current in the zero field state, $I_c(0)$. In the quiescent state the bias current goes through a short circuit at the Josephson junction to ground. When the magnetization generated by the control current suppresses the critical current of the junction, the bias current is delivered to the load. The magnetic field generated from the current $I_w$ is relatively weak, and large values of control current are necessary. Nonetheless, it is possible to choose conditions (such as a long, narrow wire or multiply stacked junctions) such that $I_w \approx I_B$ and the current gain of the device is sufficiently close to unity that devices can be linked together in a way to function as a logic gate.

This magnetic field controlled device has the advantage over the QUITERON that the switching does not rely on quasiparticle dynamics and therefore is not restricted by quasiparticle (and possibly thermal) recovery times. Fast switching times can be achieved, requiring only ultrashort current pulses and thereby minimizing the switching energy. Unfortunately, like the QUITERON this is a latching switch because Josephson junctions are typically hysteretic. Once switched to a finite voltage state, the voltage itself prevents the reestablishment of a supercurrent.

Some features of this device that should be noted are (1) the applied $\vec{B}$ field is applied in only one direction, and is modulated only in that direction, (2) the $\vec{B}$ field is applied through a two terminal wire, and (3) the device uses a standard Josephson junction.

SUMMARY OF THE INVENTION

Accordingly, it is an object of this invention to provide a superconducting switch.

It is a further object of this invention to provide a superconducting logic switch.

It is a further object of this invention to provide a superconducting power switch.

It is a further object of this invention to provide a superconducting switch with a continuous range of output states, i.e., an analog switch.

It is a further object of this invention to provide a superconducting memory.

It is a further object of this invention to provide a non-latching superconducting switch.

It is a further object of this invention to provide volatile and non-volatile superconducting switches.

It is a further object of this invention to provide a superconducting switch that has tunable properties.

It is a further object of this invention to provide a high gain superconducting switch.

It is a further object of this invention to provide a superconducting switch with a broad operational range.

It is a further object of this invention to provide a superconducting switch with a fast switching time.

These and additional objects of the invention are accomplished by the structures and processes hereinafter described.

The present invention is a switch including a pathway (typically a stripline) of a superconductive material and a ferromagnet, has a first state where the fringe fields from the ferromagnet do not exceed a threshold to drive the stripline into the normal (metallic) state, and the stripline is entirely superconductive, and a second state where the fringe fields from the ferromagnet do exceed a threshold to drive the stripline into the normal state, and the stripline is at least partially in the normal state.

Another aspect of the present invention is such a switch, where the second state creates a weak link or its equivalent in the stripline.

Another aspect of the present invention is the foregoing switch where the direction of the magnetization of the ferromagnet is modulated by a writing mechanism, typically including one or more write lines.

Another aspect of the present invention is the foregoing switch where the ferromagnet is adapted for suppressing superconductivity in the stripline over a continuous range, to provide a continuous output range for the stripline.

Another aspect of the present invention is a switched circuit having the foregoing switch connected in parallel to a load.

Another aspect of the present invention is a switched circuit having the foregoing switch connected in series to a load.

Another aspect of the present invention is a logic gate having two or more of the foregoing switches, wherein a write line for one of said switches acts as a load for a second of said switches.

Another aspect of the present invention is a memory element having the foregoing switch with a ferromagnetic layer having two easy axes of magnetization, and write lines for magnetizing this ferromagnetic layer along these two easy axes.

Another aspect of the present invention is a digital voltage amplifier having the foregoing switch, where the ferromagnetic layer has a single easy axis of magnetization, and having a write line for magnetizing this ferromagnetic layer along an axis other than the easy axis of magnetization.

Another aspect of the present invention is an induced Josephson junction having a superconductive pathway, and a controllable source of magnetic fringe fields, where the fringe fields suppress superconductivity in at least one region of the superconductor to form a weak link in the superconductor.

Another aspect of the present invention is a method of changing the state of a superconductive stripline from superconducting to at least partially normal having the step of changing the direction of the magnetization of a ferromagnet in proximity to the superconductive stripline, thereby changing the position of fringe fields from the ferromagnet, so that these fringe fields from the ferromagnet induce a change in the magnetic field of at least a portion of the superconductive stripline, changing at least a portion of the stripline to the normal state from the superconducting state.

Another aspect of the present invention is a method of changing the state of a superconductive stripline from superconducting to at least partially normal and then back to superconducting, having the steps of (1) changing the direction of the magnetization of a ferromagnet in proximity to the superconductive stripline, thereby changing the position of fringe fields from the ferromagnet, so that these fringe fields from the ferromagnet induce a change in the magnetic field of at least a portion of the superconductive stripline, changing at least a portion of the stripline to the normal state from the superconducting state, and (2) changing the direction of the magnetization of ferromagnet back to its original direction, thereby returning the fringe fields to their original positions, so that these fringe fields no longer induce a sufficient magnetic field in the stripline for the stripline to be forced to the normal state, thus allowing the stripline to return to the superconducting state.

BRIEF DESCRIPTION OF THE DRAWINGS

A more complete appreciation of the invention will be obtained readily by reference to the following Description of the Preferred Embodiments and the accompanying drawings in which like numerals in different figures represent the same structures or elements, wherein.

DETAILED DESCRIPTION OF THE PREFERRED EMBODIMENTS

The present invention is governed by the suppression of superconductivity by a magnetic field, and the existence of a critical field $H_c$ that will drive a superconductor to the normal state. This can be a highly localized phenomenon, where only a portion of a superconductive film goes to the normal state. In fact, the phenomenon may be sufficiently localized that the non-superconducting portion of the film constitutes a weak link.

$H_c$ depends on a number of parameters, including reduced temperature ($t=T/T_c$) and current density. Conversely, superconducting properties change with magnetic field conditions.

Figure 1:
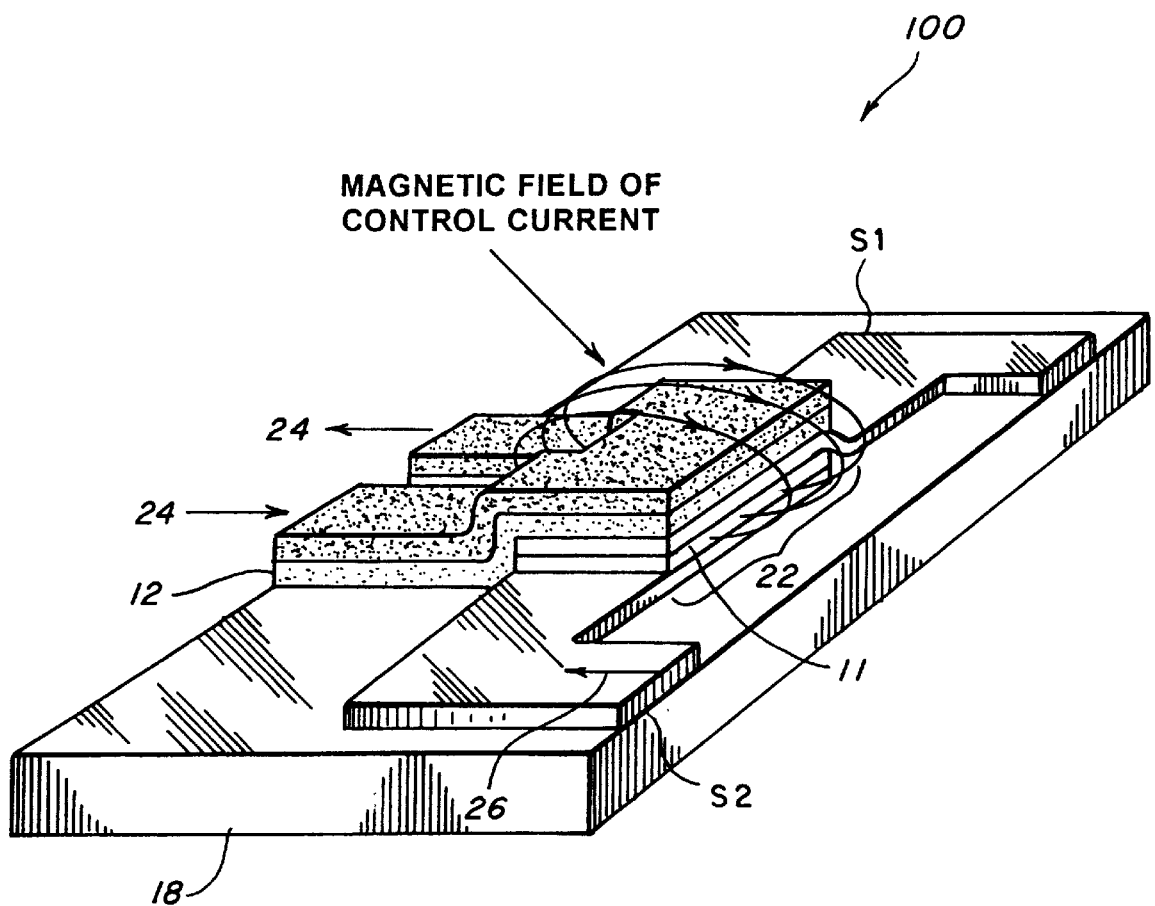
FIG. 1 shows an elevation of a superconducting switch of the prior art.
Figure 2:
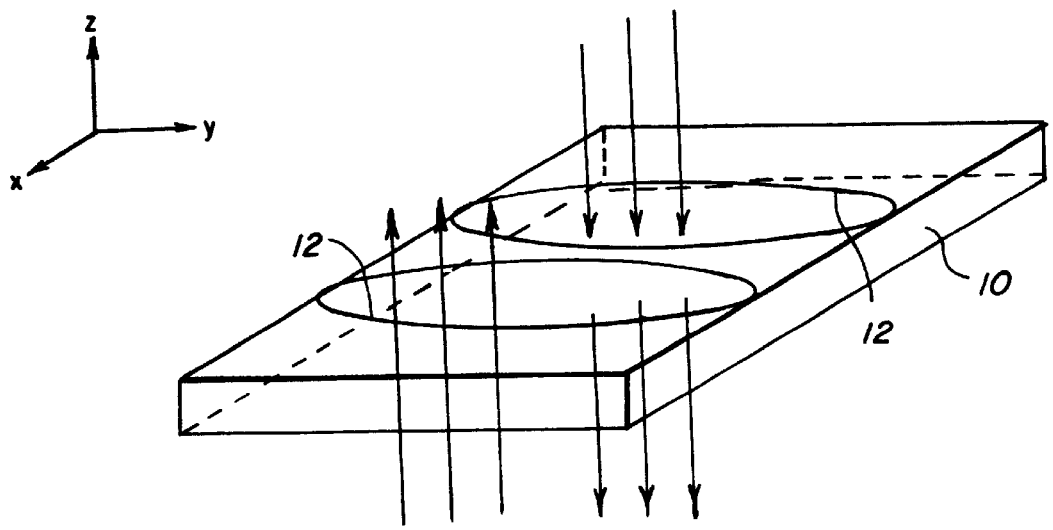
FIG. 2 shows an elevation of a superconducting stripline with a high field.
Figure 3:
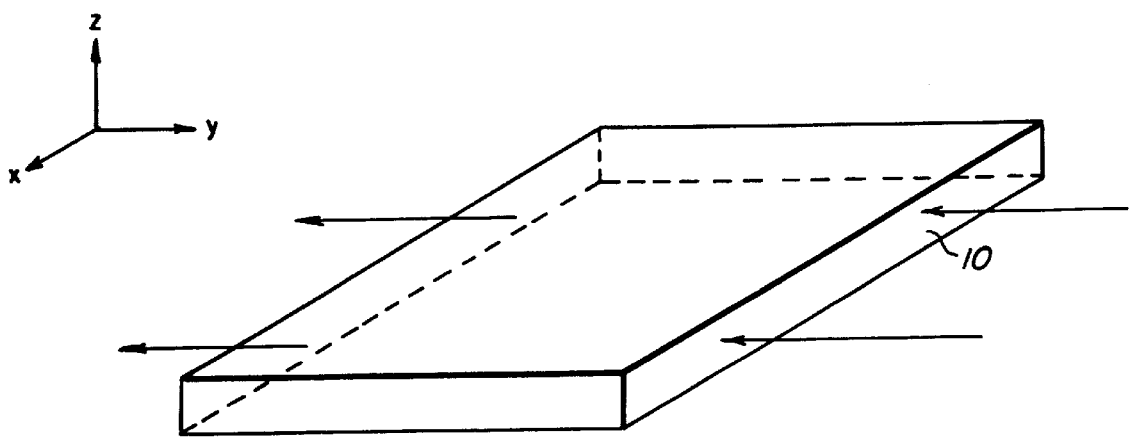
FIG. 3 shows an elevation of a superconducting stripline with a low field.

Referring to FIGS. 2 and 3, these figures show a superconducting stripline 10, with an x-y-z coordinate system shown for reference. In FIG. 2, the superconducting stripline 10 has a high magnetic flux density in localized areas 12. This high field is in excess of $H_c$, and consequently superconductivity is suppressed in these regions, and the stripline is in the normal state here. If conditions are selected appropriately, these localized regions 12 will act as weak links. FIG. 2 shows the magnetic field lines perpendicular to the plane of the stripline (i.e., in the direction of the z-axis), the optimum field orientation for the suppression of superconductivity in these regions. As will be seen below, this orientation of the field lines permits the use of fringe fields from a ferromagnetic film (not shown) to induce these field lines.

In contrast, in FIG. 3 the field near the same superconducting stripline 10 is weak and parallel to the plane of the stripline. This field is considerably less than $H_c$ at every point in the stripline, and consequently superconductivity is, for all practical purposes, unaffected in the stripline, and the stripline is in the superconductive state here.

The present invention relies upon these distinct states, where in one state the superconductive stripline is at least partially normal, and in the other state the superconductive stripline is entirely superconductive. The structures and methods of the present invention will provide for switching between these two states.

Figure 4:
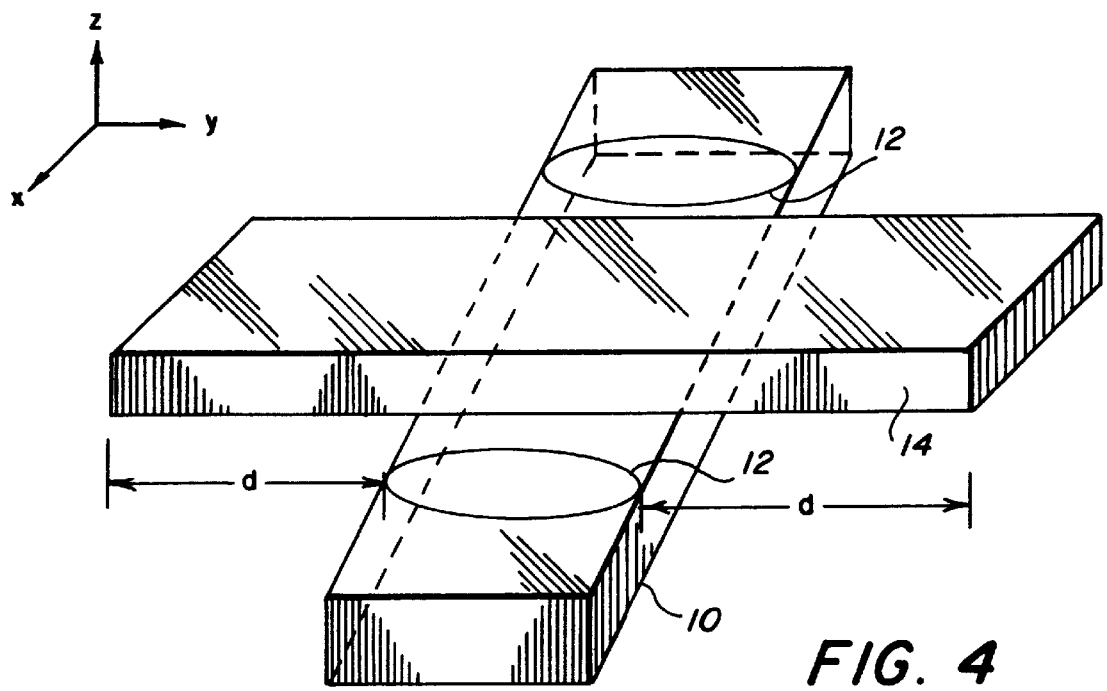
FIG. 4 shows an elevation of a device according to the invention.

FIG. 4 shows a simple device according to the invention that will provide such switching between these two states. This device has a superconducting stripline 10, and a ferromagnet 14. The ferromagnet 14 preferably has at least two easy axes of magnetization, shown here by the double-headed arrows parallel to the x- and y-axes. The ferromagnet is positioned so that when the ferromagnet is magnetized in the direction of one of the easy axes of magnetization, the fringe fields from the ferromagnet have a high flux density through at least a portion of the superconducting stripline, suppressing superconductivity to a degree that is sufficient to switch this portion of the stripline to the normal state, but when the ferromagnet is magnetized in the direction of the other easy axis of magnetization, the fringe fields from the ferromagnet are parallel and have a low flux density through the superconducting stripline, with no significant effect on superconductivity, and hence the stripline remains in the superconductive state.

As shown here, preferably the ferromagnetic layer is oriented perpendicular to the superconductive stripline (the stripline is oriented parallel to the x axis, and the ferromagnetic layer is oriented parallel to the y axis). When the axis of magnetization is aligned parallel to the x-axis, the superconducting stripline will be proximal to the magnetic poles at the edge of the ferromagnetic layer, the local magnetic field will be high and oriented essentially perpendicular to the stripline. In contrast, when the axis of magnetization is aligned parallel to the y axis, the superconducting stripline 10 will be distal from the magnetic poles at the ends of the ferromagnetic layer 14, the local magnetic field will be low and oriented essentially parallel to the stripline. See the magnetostatic model discussed in the context of FIG. 8, below. The "overhang" distance along the x-axis between the superconducting stripline 10 and the ferromagnetic layer 14, shown in FIG. 4 as d, should be large enough in this latter case to ensure that the local magnetization will be low and oriented essentially parallel to the stripline, but small enough to keep the total device size within acceptable limits. An overhang distance of about 1 μm has been found to be sufficient for microelectronic size scale devices according to the present invention.

Skilled practitioners will recognize that there are many ways to fabricate a ferromagnetic layer to have two easy axes of magnetization. The following methods are set forth for illustration purposes, and are not intended as an exhaustive list. Skilled practitioners will recognize that several methods may be combined.

One method for providing an easy axis of magnetization is to use shape anisotropy: the tendency for magnetization $\vec{M}$ to align along the major axis of a ferromagnetic body having a high aspect ratio.

Another method for providing an easy axis of magnetization is to use crystalline anisotropy: the tendency for magnetization $\vec{M}$ to align in certain directions in bulk ferromagnetic materials of certain crystallographic structures. Crystalline anisotropy may be modulated by the growth techniques employed, following known principles. Multilayers of ferromagnetic materials having different crystalline anisotropies may be used to make ferromagnetic structures with two or more easy axes of magnetization. Polycrystalline ferromagnetic films deposited in the presence of a magnetic field will have one or more easy axes.

Another method for providing an easy axis of magnetization is to use exchange coupling with another layer that has the preferred easy axis of magnetization.

Figure 4A:
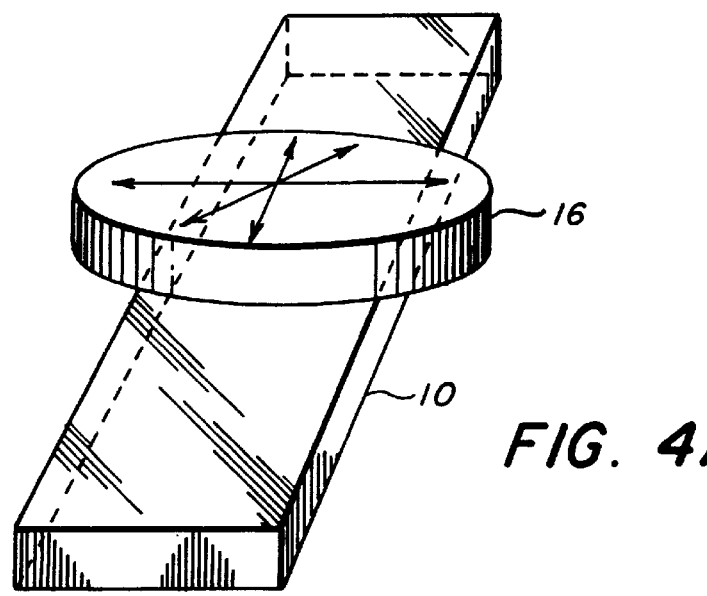
FIG. 4A shows an elevation of another device according to the invention.

Alternatively, as shown in FIG. 4A, the ferromagnetic layer 16 may have many easy axes of magnetization, or may be magnetized in any direction parallel to the x-y plane. In this embodiment of the invention, each direction of the magnetization vector corresponding to a different fringe field intensity in the stripline 10 will suppress superconductivity in the stripline 10 to a different degree. Consequently, the switch will have many output levels, or a continuous range of output levels (i.e., analog output).

Positioning the ferromagnetic layer having the two or more easy axes of magnetization with respect to the superconductive stripline will require consideration of several concerns. As skilled practitioners will recognize, placing the superconductive stripline as close as possible to an edge of the ferromagnetic layer (refer to the magnetostatic model discussed in the context of FIG. 8, below) with a high magnetic pole density in a given magnetization state will maximize the magnetic flux through the superconductive stripline, creating the maximum suppression of superconductivity. However, when a superconductor is adjacent to a normal conductor, the normal conductor will tend to suppress the superconducting properties (including $T_c$, $H_c$, and $J_c$) of the superconductor. Additionally, the normal conductor may exhibit some superconducting properties. This phenomenon is known as the proximity effect, and as the name indicates it falls off dramatically with distance. An intervening insulating layer of a few angstroms thickness between the ferromagnetic layer and the superconductive stripline will largely eliminate the proximity effect.

With this explanation of some of the physics of the devices of the present invention, particular embodiments of the invention may now be appreciated.

Figure 5:
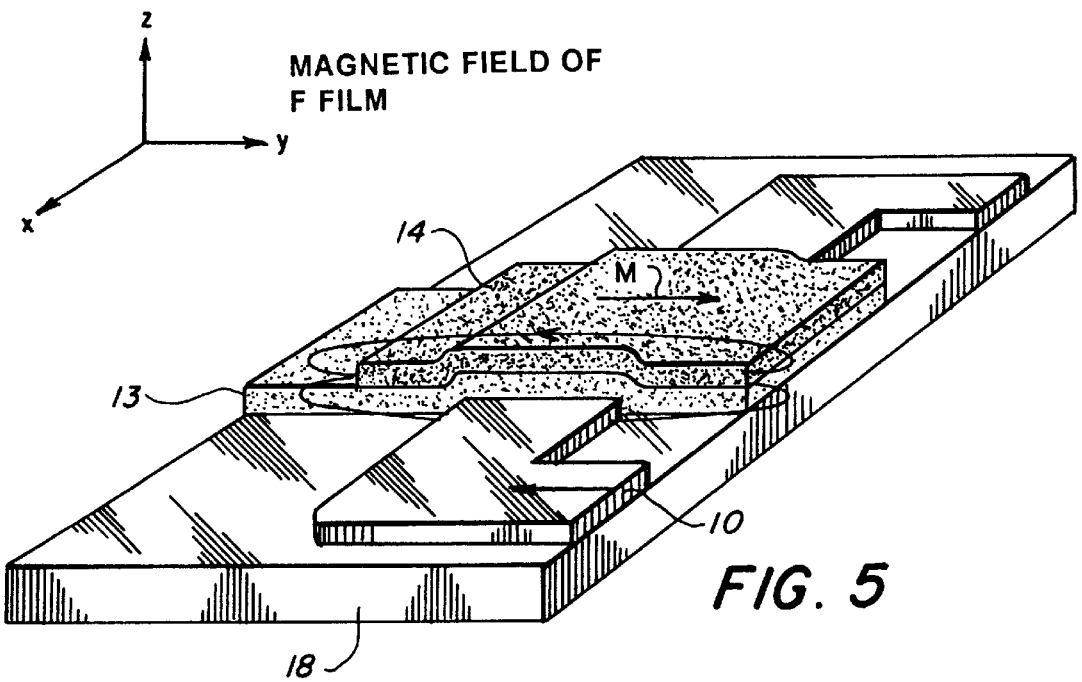
FIG. 5 shows an elevation of a preferred device according to the invention, with a ferromagnet magnetized in one direction corresponding to one switch state.

FIG. 5 shows an elevation of a preferred device according to the invention. This device has a superconductive stripline 10 disposed on a substrate 10. The superconductor may be any of the known high temperature superconductors (HTS) or low temperature superconductors (LTS). Suitable HTSs include superconductors in the 123 family, such as YBaCuO, and superconductors in the 2212 and 2223 families. Suitable LTSs include Sn, Pb (used in a prototype of the present invention), Nb (typically used for low-temperature Josephson junctions), and various binary superconductors such as PbIn. Standard references on superconductivity, such as T. P. Orlando & K. A. Delin, "Foundations of Applied Superconductivity" (Addison-Wesley, 1991), contain additional information on the parameters and properties of various superconductors. Superconductive striplines will typically be on the order of 100–1000 Å thick.

Figure 6:
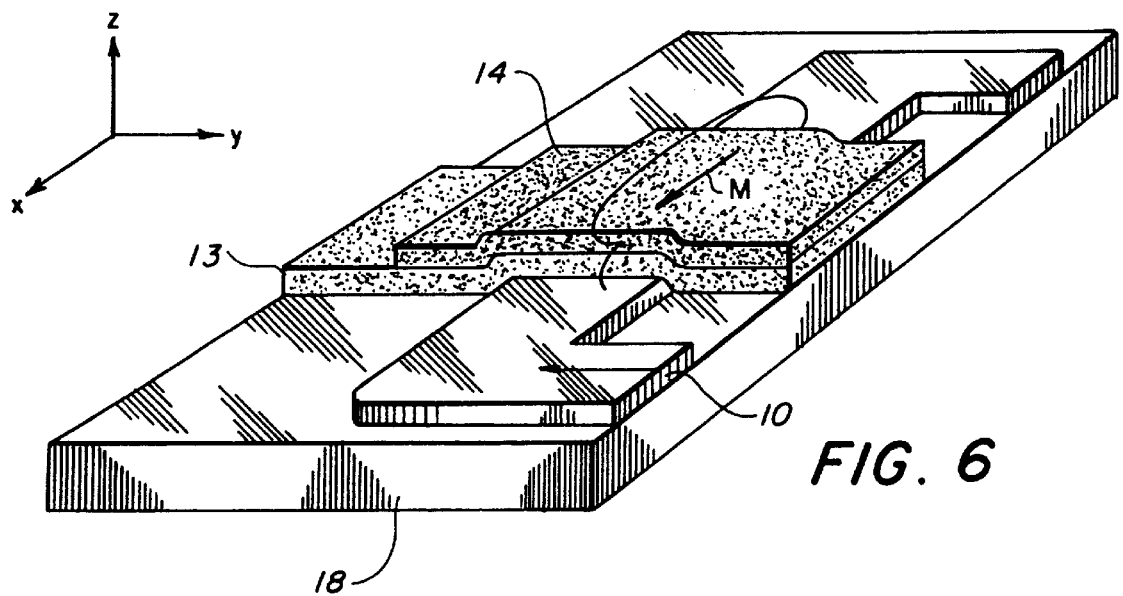
FIG. 6 shows an elevation of the same preferred device according to the invention, with the ferromagnet magnetized in another direction corresponding to another switch state.

Disposed across the stripline 10 is a ferromagnetic layer 14. This ferromagnetic layer has two easy axes of magnetization: one where the magnetic poles are not directly over the superconductive stripline, as shown here, and one where the magnetic poles are directly over the superconductive stripline, as shown in FIG. 6. These two magnetization states correspond to the two states for the switch, as explained above. As shown in FIG. 5, the field has no significant effect on superconductivity, and does not induce a superconducting-to-normal transition in the stripline. As shown in FIG. 6, the field strongly suppresses superconductivity, and does induce a superconducting-to-normal transition in the stripline.

Preferably, interposed between the stripline 10 and the ferromagnetic layer 14 is an insulating layer 13 for prevention of the proximity effect. The selection of the insulator will be guided by the selection of the superconductor. Native oxides will often be used for the elemental and binary superconductors. For Nb, aluminum oxide is frequently selected as the insulator of choice. Typical insulator thicknesses are on the order of a few Å (e.g., 2–10 Å).

Although in FIGS. 5 and 6 the ferromagnetic layer is disposed over the superconductive stripline, it could be alternatively disposed under the superconductive stripline. The ferromagnetic layer is typically oriented at a right angle to the superconductive stripline, so that if the direction of the superconductive stripline is taken to be in the x direction, the major axis of the ferromagnetic layer is in the y direction. The ferromagnetic layer preferably has a square or rectangular footprint.

Preferably, the ferromagnetic layer is made from a soft ferromagnetic material, such as Fe, Co, FeCo alloys, NiFe alloys (permalloy), and unannealed RE-TM-B alloys such as $Nd_2Fe_{14}B$. Desirable properties for the ferromagnetic layer are low values for coercive field and large magnetic moments. Typical dimensions for such a ferromagnetic layer are from 1–10 $\mu$m long, and about 100 nm thick. It is desired to keep the ferromagnetic layer much thicker than the superconductive stripline, to enhance the uniformity of the magnetization.

Dimensions for the devices will also be guided by the desired applications. For logic applications, stripline and ferromagnetic layer widths from a few $\mu$m to sub-$\mu$m will be preferred. Power transmission applications may entail larger devices, as skilled practitioners will appreciate.

Not shown here, but discussed below, is a mechanism for switching the ferromagnetic layer between magnetization in the direction of one of the easy axes of magnetization and magnetization in the direction of the other easy axis of magnetization. When magnetized in one of the two easy directions, the ferromagnetic layer will exhibit magnetic remanence, and will have local dipolar fringe fields that are large near the magnetic poles at the film edges, and smaller elsewhere.

Figure 7:
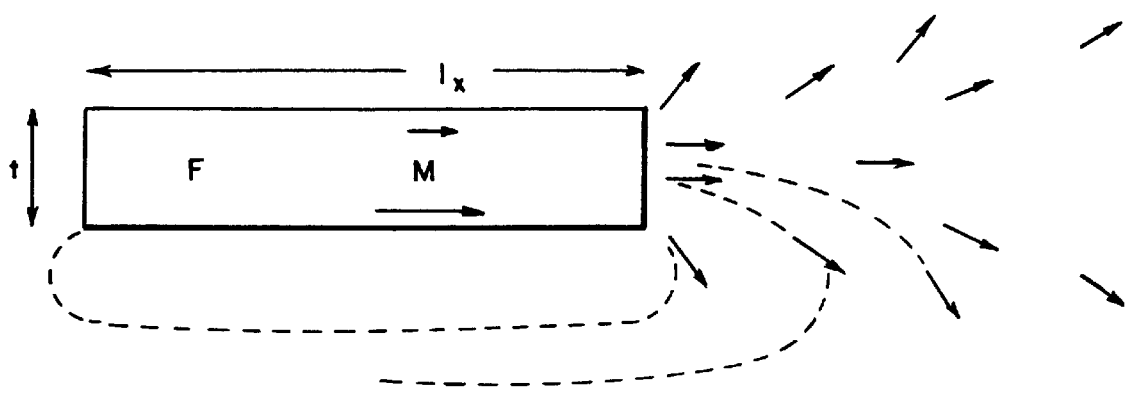
FIG. 7 shows a section of a ferromagnetic film, with the associated fringe fields shown.

In FIG. 7, a thin ferromagnetic film 14 with thickness t and dimension $l_x$ along the x axis is shown in cross-section (not to scale). The amplitude and direction of the vector fringe magnetic field $\vec{B}$ is qualitatively represented by the arrows, and the dotted field lines are drawn tangent to all field vectors, thereby representing the direction of the field $\vec{B}$. Near the edge of the film the magnitude of B is approximately equal to the value 4πM of F, which is on the order of 10,000 Oe for permalloy. If an insulating film of thickness $z_0$ separates the F film from the surface of the superconductor S, then directly beneath the edge of F film the fringe field is substantially perpendicular to the surface of S (oriented along −z) and has a magnitude that decreases rapidly with distance. The magnitude of the field can be approximated using the following simple model. The surface density of magnetic poles of a material with magnetization M is equivalently M. The fringe field at distances of the order of the thickness of the film is approximately the same as that generated by a line source of magnetic poles of density $\lambda_m$=t.M and located in the middle of the end surface of F.

Figure 8:
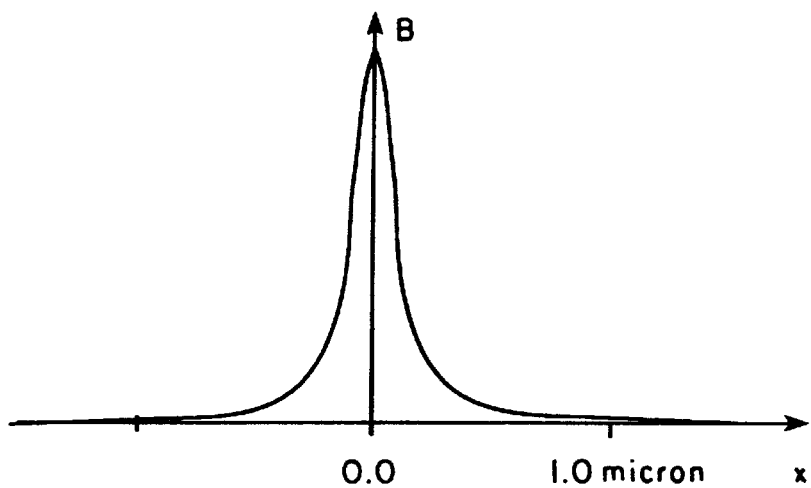
FIG. 8 graphs the profile of the magnitude of the z-component of a fringe field.

The profile of the magnitude of the z-component of fringe field $B_z$ is sketched in FIG. 8 for a permalloy film with d=100 nm and $z_0$=50 nm. The peak value of field is of order 1000 Oe, and the magnitude falls to very low values within a few tenths of a micrometer. It is noteworthy that the fields which control the state of the device are principally produced by the edge of the film F rather than the bulk, and thus it is possible to shrink the device to very small dimensions. Additional information may be found in J. R. Reitz, F. J. Milford, & R. W. Christy, "Foundations of Electromagnetic Theory", (3d. ed., Addison-Wesley, 1990).

Figure 9:
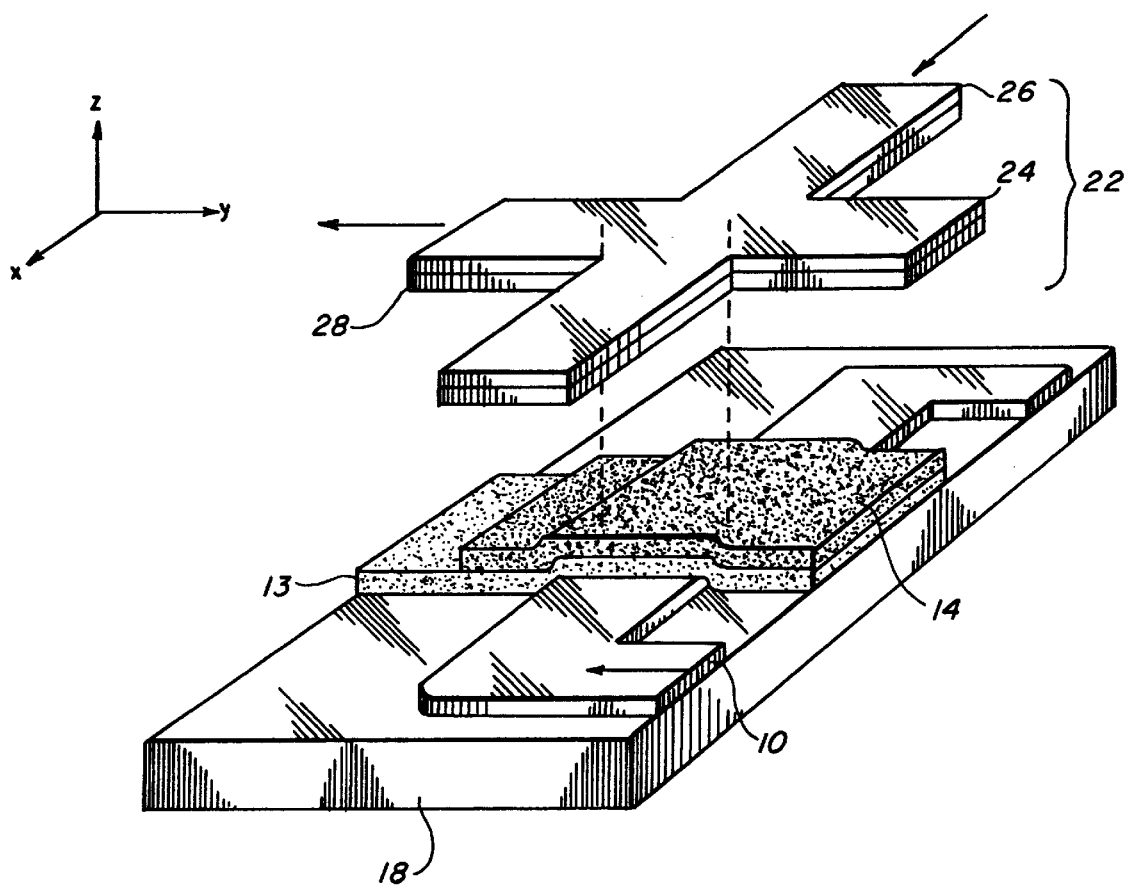
FIG. 9 shows an exploded view of a preferred device according to the invention, with a writing circuit for magnetizing the ferromagnet in two different directions.

Switching the direction of magnetization in the ferromagnetic layer may be effected by a wide range of mechanisms, including external magnets, a pair of stacked writing circuits, or a single writing circuit, such as the one shown in FIG. 9. Typically, write circuits will be used to induce switching actions. Referring now to FIG. 9, this figure shows an exploded view of a preferred device 20 according to the invention, with a writing circuit 22 for orienting the magnetization of the ferromagnetic layer 14 in two different directions.

A pair of intersecting write lines 24,26 are fabricated above the ferromagnetic layer 14 and are isolated from the device by a thin insulating layer 28. A current driven down the wire aligned along x 26 (or y 24) generates a magnetic field at the position of the ferromagnetic layer 14 that is oriented along y (or x). This field is largest near the surface of the write line, and the field magnitude decays as the distance from the write line is increased. The magnitude of the field at the ferromagnetic layer depends on the geometry of the write line and the distance between it and the ferromagnetic layer. As an order of magnitude estimate, a write wire 4 $\mu$m wide, 100 nm thick and separated 10 nm from the ferromagnetic layer would generate a field of magnitude H'=10 Oe for 5 mA of write current. Transition metal ferromagnets have coercivities of order a few Oe, and H' is sufficient to saturate the magnetization along a chosen direction. The orientation of the magnetic field follows the right hand rule, so that a current pulse along the wire aligned with the x-axis 26 will orient the magnetization of the ferromagnetic film 14 along the y-axis. Fringe fields from this magnetization will be of the type described supra in the context of FIG. 3. Conversely, a current pulse along the wire aligned with the y-axis 24 will orient the magnetization of the ferromagnetic film 14 along the x-axis. Fringe fields from this magnetization will be of the type described supra in the context of FIG. 2. The magnetization changes orientation on a time scale of order ns or less, and controlling the state of the device can be achieved with short pulses of write current. If the magnetization of ferromagnetic film 14 has a sufficient remanence, after the short write pulse is removed, the remanent magnetization will be sufficient to maintain the switch in its state. Thus, the switch will have non-volatile operation.

Figure 10:
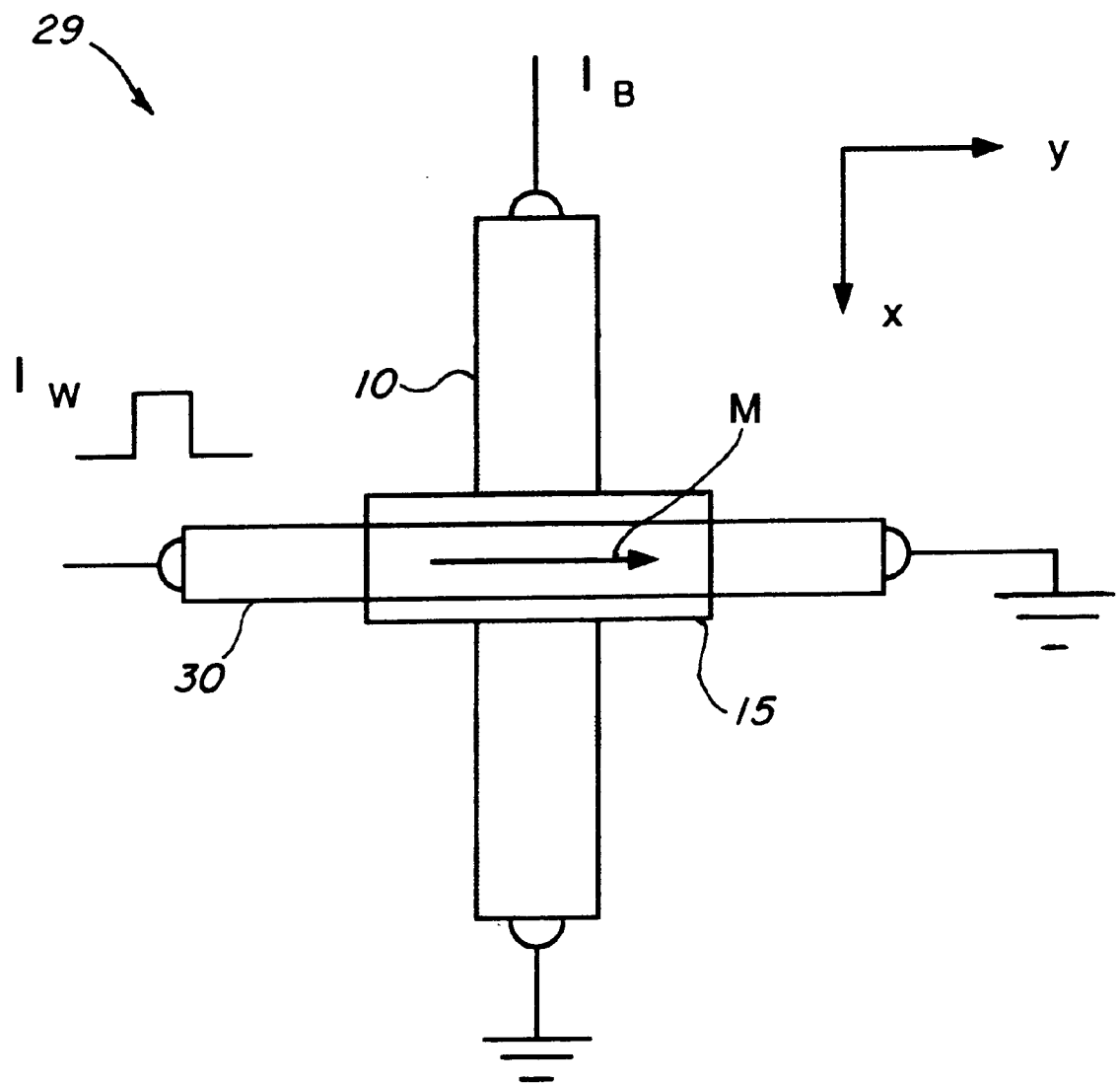
FIG. 10 shows an elevation of another preferred device according to the invention.

Referring to FIG. 10, another switch 29 according to the invention has a superconductive stripline 10, and a ferromagnetic layer 15 disposed over the stripline (for clarity, other features, such as the insulating layer, are not shown). The ferromagnetic layer 15 is magnetized and has a uniaxial magnetization anisotropy along y, i.e. a single easy axis of magnetization oriented perpendicular to the stripline. Thus, the quiescent state for this ferromagnetic layer is with the magnetization oriented parallel, or nearly parallel, to the y axis. This embodiment of the invention also has a write line 30 for magnetizing the ferromagnetic 15 layer in the x direction while a writing pulse, depicted as $I_w$, is passed through the write line. After the writing pulse is removed, the magnetization returns to the y direction. Thus, the fringe fields from the ferromagnetic layer will put the superconductive stripline in the normal state during the duration of the writing pulse, and will be in the superconducting state at other times. Thus, the switch will have volatile operation.

Figure 11:
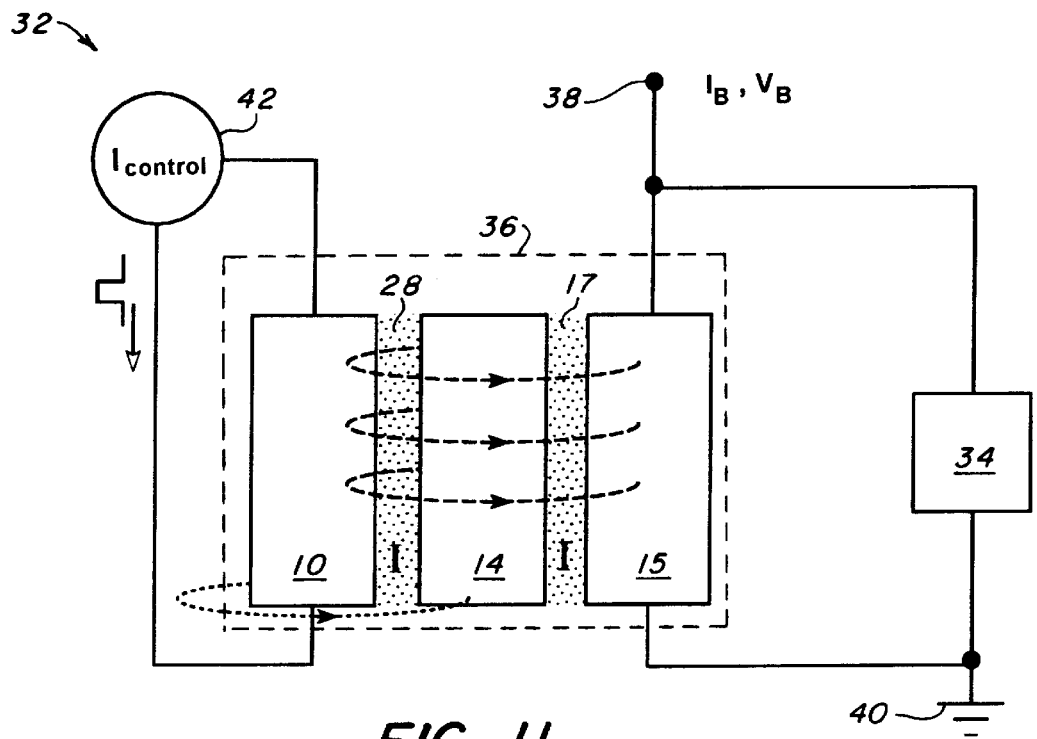
FIG. 11 shows a schematic of a switched circuit according to the invention.

Referring to FIG. 11, this figure shows a schematic of the present invention as it may be operated as a current switch. This figure shows switched circuit 32 with a load 34 connected in parallel to a switch 36 according to the invention between the bias current source 38 and ground 40. The switch 36 includes a superconductive stripline 10, a ferromagnetic layer 14, and a write line 30, according to one of the embodiments of the invention. A control current source 42 is used to set the state of the superconducting switch 36. When the switch is in the superconducting state, the bias current is grounded through the switch 36. When the switch is in the normal state, current and voltage pass through the load 34 to ground.

Figure 12:
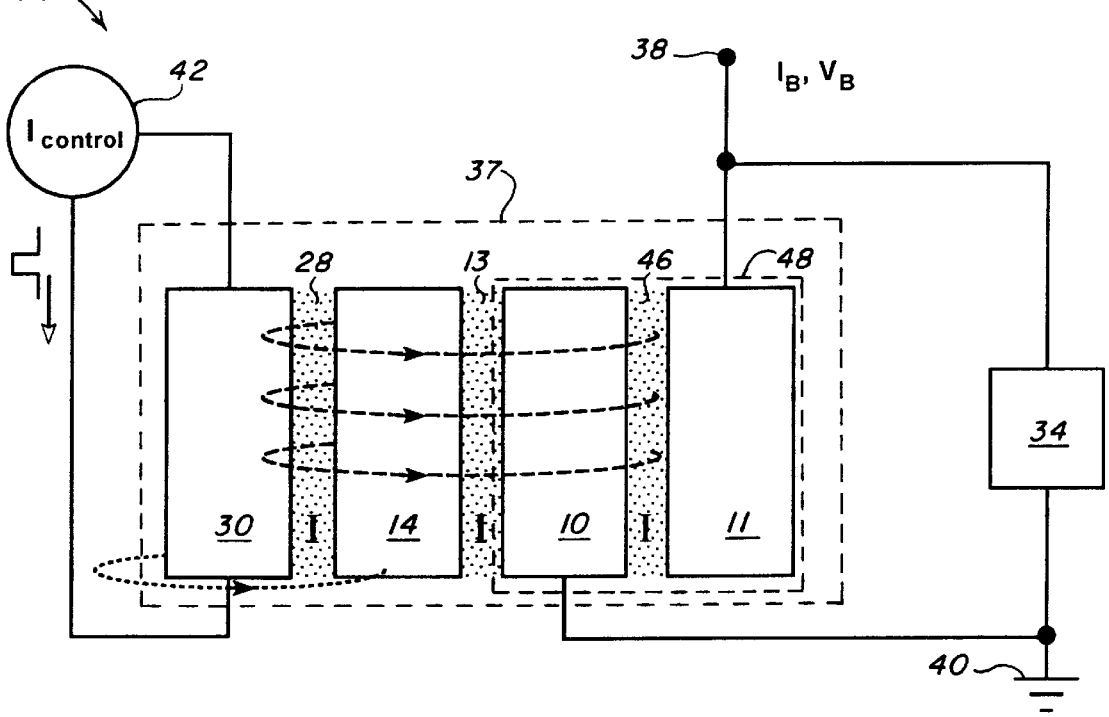
FIG. 12 shows a schematic of another switched circuit according to the invention.

Referring to FIG. 12, this shows a schematic of an alternative switched circuit 44 according to the present invention. In this embodiment, the switch 37 has two superconductive layers 10,11 connected by an insulating layer 46 to form a Josephson junction 48. The tunnel barrier 46 between the superconductive layers is coupled to the ferromagnetic layer 14 so that the fringe fields of the ferromagnetic layer may switch the Josephson junction from the normal state to the superconductive state, according to the principles of the invention. Thus, the ferromagnetic layer will modulate the operation of the Josephson junction 48.

Figure 13:
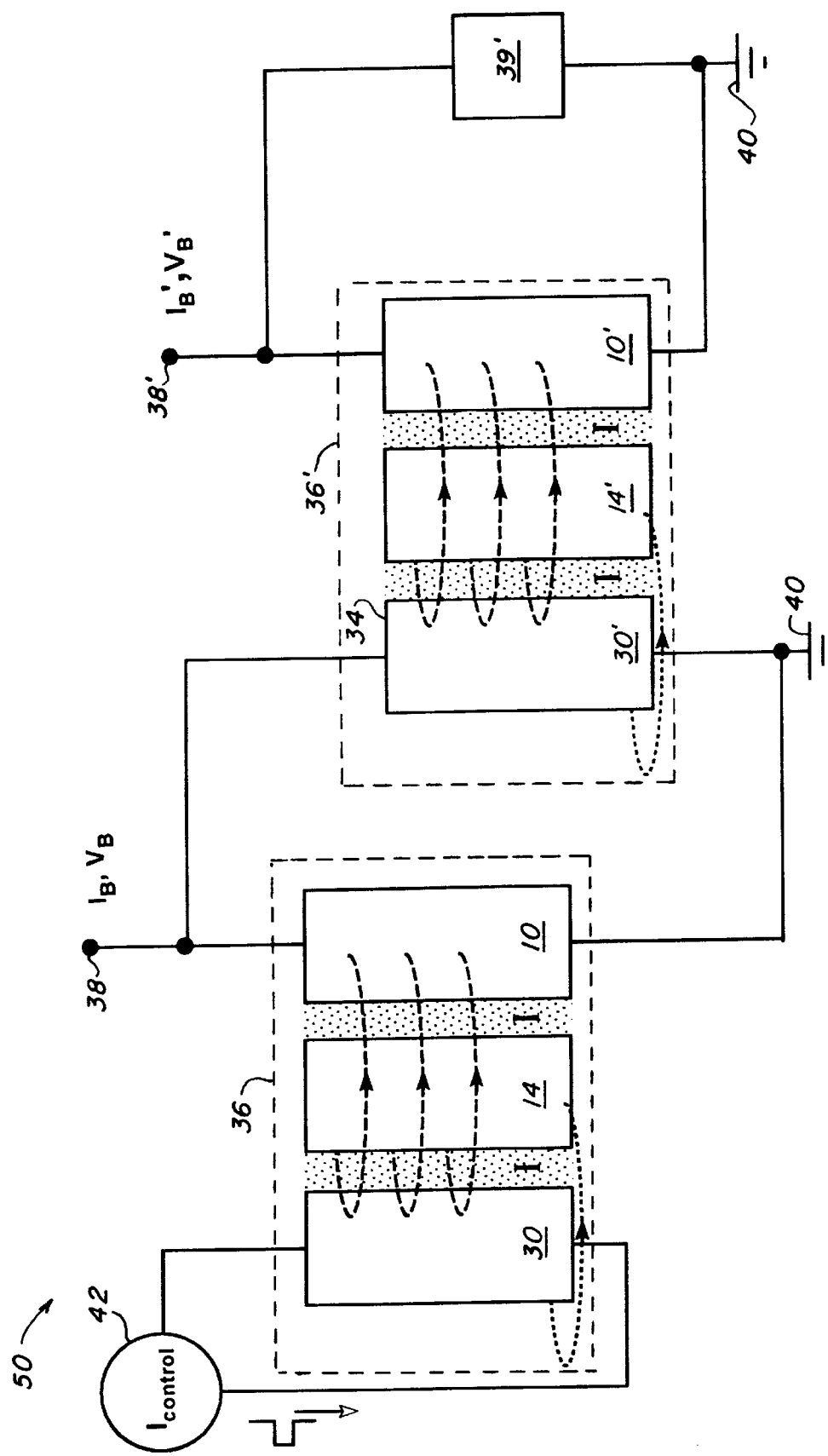
FIG. 13 shows two switched circuits according to the invention connected to make a logic gate.

If the load in either of these embodiments includes the write line for another superconductive switch according to the invention as shown in FIG. 13, then this permits multiple switches according to the invention to be linked together to form an array or logic structure. Referring to FIG. 13, this shows a schematic of a simple array 50 according to the present invention. This array includes a first switch 36 and a second switch 36', each having a superconducting stripline 10,10', a ferromagnetic layer 14,14' for switching the state of the superconducting stripline 10,10', and a write wire 30,30', for setting the magnetization state of the ferromagnetic layer 14,14', according to the principles of the present invention described supra. The first 36 and second 36' switches are connected in parallel through the first bias current source 38 to ground 40, so that the write wire 30' of the second switch 36' serves as the load 34 for the first switch 36. This second switch 36' is in turn connected in parallel to a load 34', which may likewise be a write wire for a switch, through a second bias current source 38' to ground 40. In operation, as bias currents $I_B$ and $I_B'$ are applied to the first 10 and second 10' striplines, a control signal $I_{control}$ is sent from the control current source 42, to set the state of first superconducting switch 36. When the first switch 36 is in the superconducting state, the second switch 36' is bypassed. When the first switch 36 is in the normal state, the write wire 30' in the second switch 36' is activated, setting the state of the second switch 36', as described supra.

Figure 14:
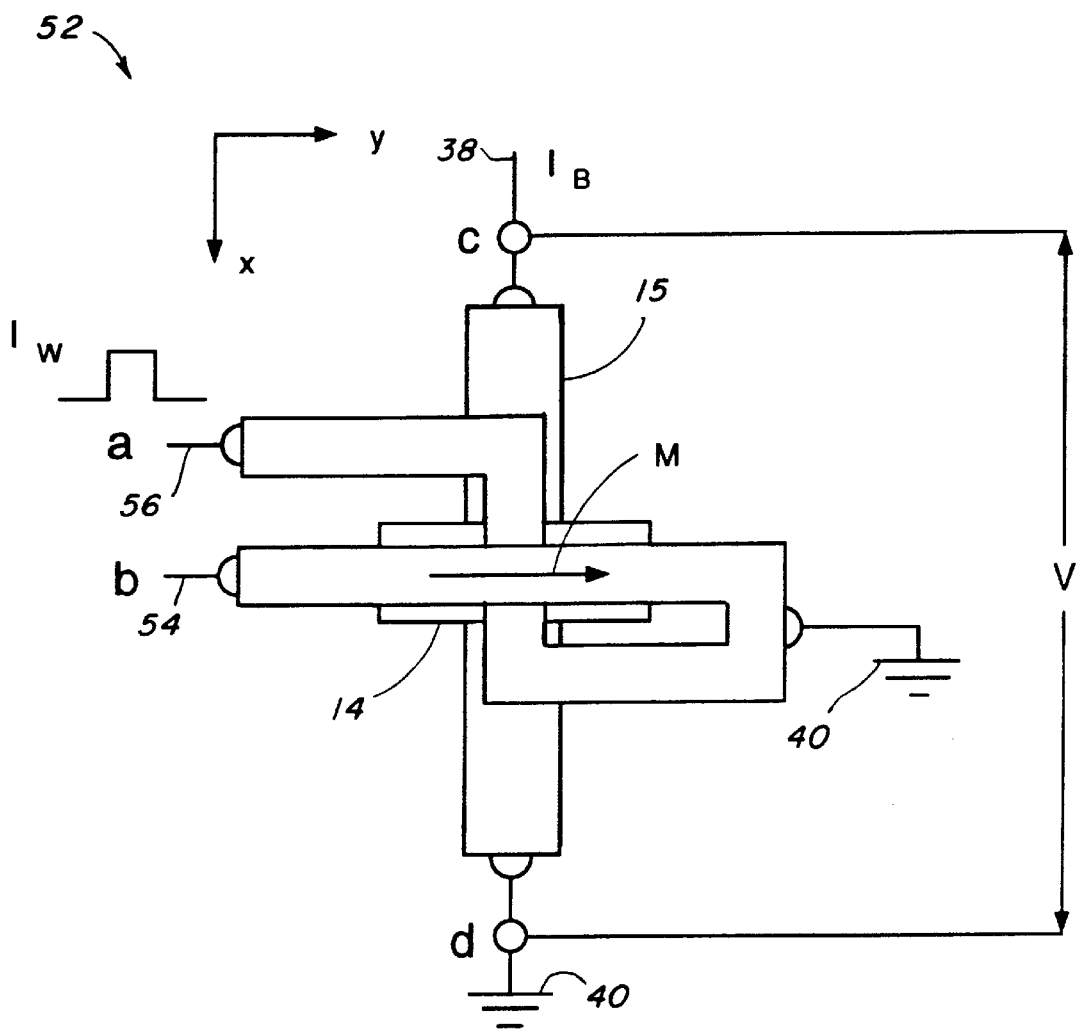
FIG. 14 shows a non-volatile memory element according to the invention.

Referring to FIG. 14 a non-volatile memory element 52 according to the present invention has a superconducting stripline 10, and a ferromagnetic layer 14 with two easy axes of magnetization along the x and y axes, adapted for switching the state of the superconducting stripline 10. The memory element 52 also has a pair of write wires 54,56 coupled to sources of write current, for switching the state of the ferromagnetic layer 14. A write pulse applied to 54 or 56 will orient the magnetization along x or y and the stripline 10 will be in the normal or superconductive state, respectively. When the stripline is in the superconducting state, there will be no voltage between the bias current source 38 and ground 40. However, when the stripline is in the normal state, there will be a finite voltage across the stripline between the bias current source 38 and ground 40. The states of voltage and no voltage across the stripline may be arbitrarily assigned values of 1 and 0. If the ferromagnetic film 14 has a sufficient remanence, after the short write pulse is removed, the magnetization will be sufficient to maintain the switch in its switch state. Thus, the switch will have non-volatile operation.

Figure 15:
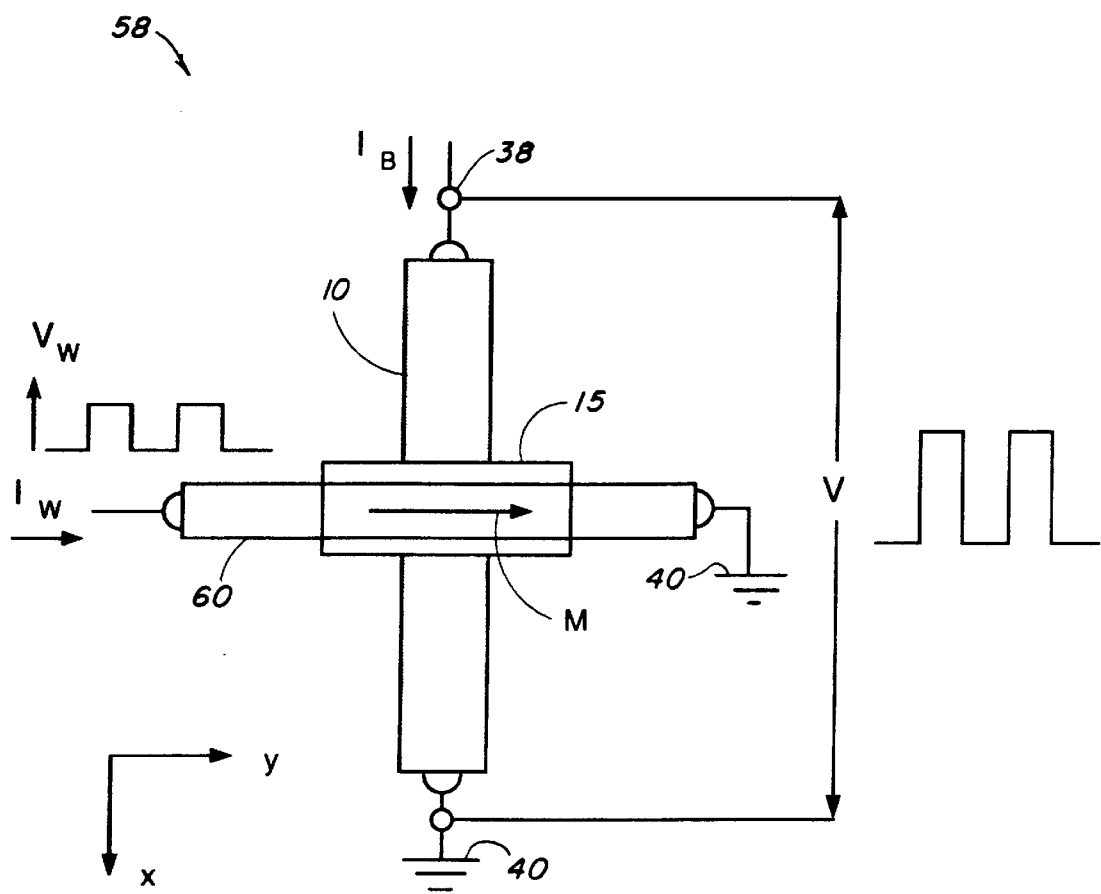
FIG. 15 shows a voltage amplifier according to the invention.

Referring to FIG. 15, a digital voltage amplifier according to the invention 58 has a superconducting stripline 10, and a ferromagnetic layer 15 with a single easy axis of magnetization, adapted for switching the state of the superconducting stripline 10. The voltage amplifier 58 also has a write wire 60 coupled to a source of write current. When a write pulse is applied, the superconductive stripline goes to the normal state, and when the write pulse is removed, the stripline reverts to the superconductive state, as described above. If the circuit impedances are arranged such that the voltage applied to the write line $V_w$ is less than the voltage V across the stripline in the normal state, $V_w < V$, then the amplifier has gain larger than unity, gain>1.

Although most of the embodiments of the present invention depicted herein have shown the ferromagnetic layer as a rectangular layer with its primary axis perpendicular to the direction of the stripline, the invention encompasses other embodiments that may be preferred for some applications. The ferromagnetic layer may be circular, as described in the context of FIG. 4A, supra. Square ferromagnetic layers have been tested successfully for the present invention. Rectangular ferromagnetic layers where the primary axis is parallel to the direction of the stripline may be preferred for some embodiments, due to the larger remanent magnetization that will be developed in this direction.

Another feature of the present invention is that the weak links of the invention may be substituted for any device where a Josephson junction would be used, such as in a SQUID. As noted supra, the properties of Josephson junctions tend to drift over time. However, the switches of the present invention, when operated in an analog mode, will provide tunable Josephson junctions, permitting periodic or continuous calibration of the junction to keep it within operating parameters.

Having described the invention, the following examples are given to illustrate specific applications of the invention, including the best mode now known to perform the invention. These specific examples are not intended to limit the scope of the invention described in this application.

EXAMPLE 1

Figure 16:
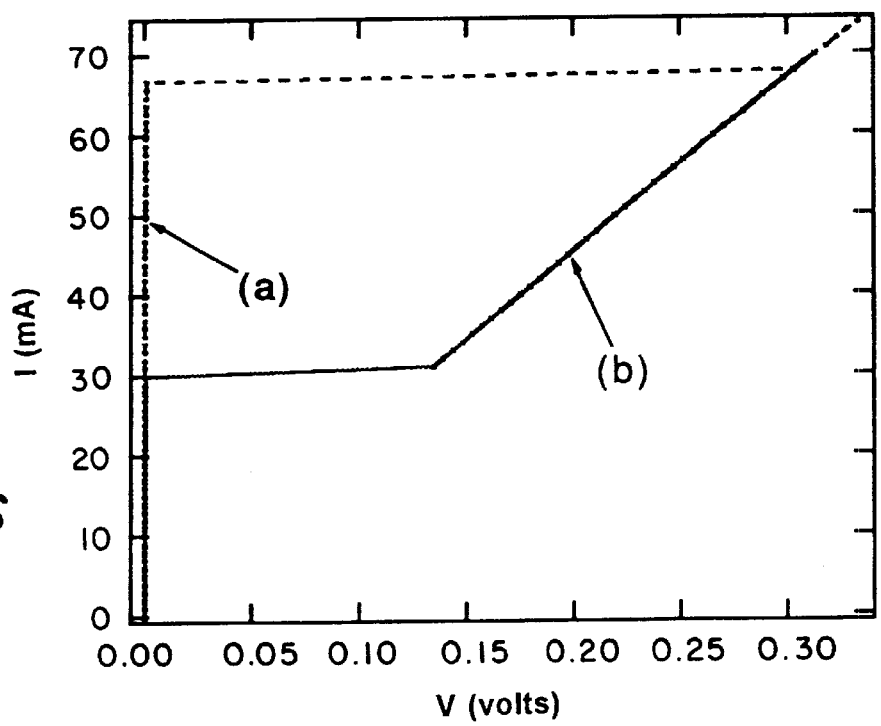
FIG. 16 shows an I-V curve for a device according to the present invention.
Figure 17:
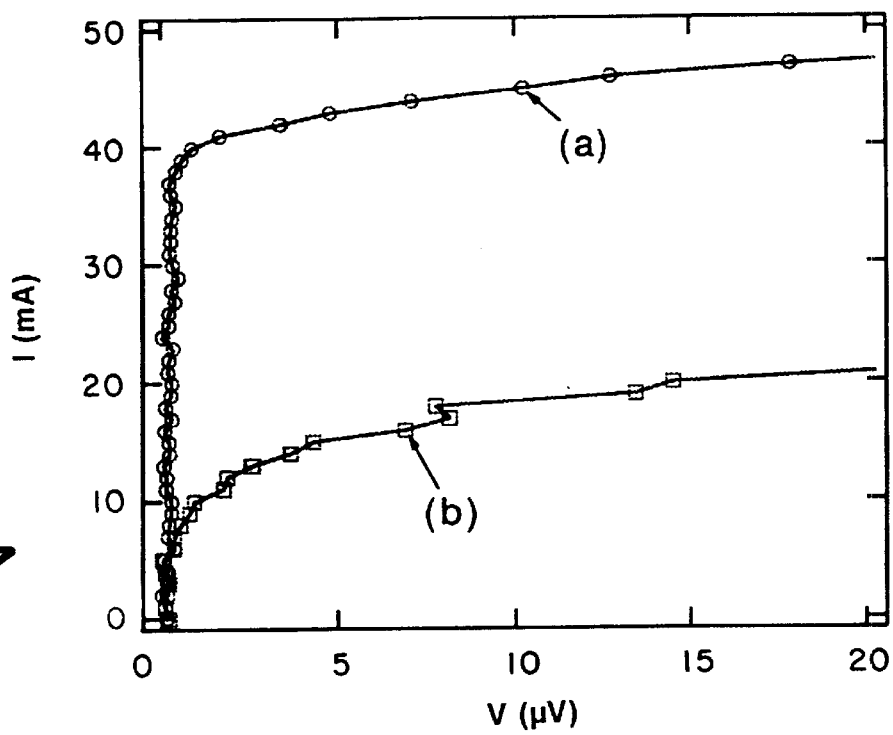
FIG. 17 shows a detail of a portion of the same I-V curve for a device according to the present invention.

A prototype of the invention was built and tested. I-V curve results are shown in FIGS. 16 and 17. The device was configured as shown in FIGS. 5 and 6. The superconducting strip S was Sn with thickness 100 nm, width 0.4 mm and length 2 cm, the insulating barrier was a thin layer of tin oxide, and the ferromagnetic layer was a permalloy layer with thickness 80 nm, width 0.4 mm and length 1 cm, oriented at a 90° angle with respect to the superconductive stripline. The magnetization of the permalloy was saturated with an external field applied along y or x, and the applied field was then reduced to zero before recording the data in FIG. 16, traces (a) and (b) respectively. Thus, each trace was taken in a quiescent state, with no applied field. In each trace the critical current $I_c$ of the superconducting Sn strip at T=3.61 K ($T_c$=3.9 K; t=0.93) was measured by biasing S with a supply current I and recording the voltage V developed across a portion of S of length 1 cm. FIG. 16 presents the full voltage range of the measurement and FIG. 17 presents a magnified view of the low voltage portion (near the left axis) with a range of only 20 $\mu$V. Following trace (a) in FIG. 17, the stripline was in a zero resistive state for currents I less than 40 mA. For $I_{c,1} \approx 41$ mA, a small portion of the strip becomes resistive and a nonzero voltage was developed. As I was increased further the voltage continued to rapidly increase as larger portions of S became normal, and at $I_{c,s}$=68 mA the entire strip was in the normal state (FIG. 16). At this and larger currents the sample showed hot spot behavior and hysteresis: the supply current had to be reduced significantly below $I_{c,s}$ before the sample made a transition to recover the superconducting state.

The same analysis can be applied to trace (b). Following trace (b) in FIG. 17, S was in a zero resistive state for currents I less than 10 mA. For $I_{c,1} \approx 12$ mA, a small portion of the strip became resistive and a nonzero voltage was developed. As I was increased further the voltage continues to rapidly increase as larger portions of S become normal, and at $I_{c,s}$=30 mA the entire strip was in the normal state. Thus, the difference in values of $I_{c,1}$ for the two orientations of remanent magnetization was a factor of approximately 4, and the difference in values of $I_{c,s}$ (the critical current for the entire strip) was a factor of about 2.3. It is clear from FIG. 16 that a bias current of $I_B$=40 mA develops approximately zero voltage when the device is in a state with remanence along y and develops a finite voltage (about 0.17 V for this sample) when the device is in a state with remanence along x. When operated in this regime, the device was latching in the sense that a constant bias current will maintain the device in the resistive state until removed. However, because the remanence was a nonvolatile state, the state of the device was not altered when the bias current was removed. In other words, the state of the device can be sensed by a current pulse of brief duration, and the state was retained even when the sense current was returned to zero.

It is clear from FIG. 17 that the device could operate in the nonhysteretic regime. For example, a bias current $I_B$=20 mA would develop a voltage of order 0.1 mV in the state with remanence along x but V=0 in the state with remanence along y. In the nonhysteretic regime the switching times will be faster than in the hysteretic ("hot spot") regime.

Obviously, many modifications and variations of the present invention are possible in light of the above teachings. It is therefore to be understood that, within the scope of the appended claims, the invention may be practiced otherwise than as specifically described.

What is claimed is:

1. A switch, comprising:
   a pathway of a superconductive material; and
   a ferromagnet;
   wherein said ferromagnet is adapted for having at least a first magnetization state and a second magnetization state;
   wherein fringe fields from said ferromagnet in said first magnetization state do not exceed a predetermined magnetic field in said superconductive pathway to convert at least a portion of said superconductive pathway to the normal state;
   wherein fringe fields from said ferromagnet in said second magnetization state exceed said predetermined magnetic field in said superconductive pathway to convert at least a portion of said superconductive pathway to the normal state.

2. The switch of claim 1, wherein said superconductive pathway is a stripline.

3. The switch of claim 1, wherein said ferromagnet has at least two easy axes of magnetization, and wherein said first magnetization state corresponds to the magnetization of said ferromagnet in the direction of a first easy axis of magnetization, and said second magnetization state corresponds to the magnetization of said ferromagnet in the direction of a second easy axis of magnetization.

4. The switch of claim 1, wherein fringe fields from said ferromagnet in said second magnetization state establish a weak link in said superconductive pathway.

5. The switch of claim 1, wherein said switch further comprises one or more write wires for setting the magnetization state of said ferromagnet.

6. The switch of claim 5, wherein said one or more write wires comprise two or more write wires.

7. The switch of claim 5, wherein said one or more write wires comprise two or more write wires, wherein a first write wire is substantially parallel to said superconductive pathway, wherein said second write wire is substantially perpendicular to said superconductive pathway, wherein said first and second write wires are adapted for setting the magnetic state of said ferromagnet to said first and second magnetization states, respectively, with the application of a write pulse to said first or said second write wires, respectively, and wherein said ferromagnet is adapted for maintaining each of said first and second magnetization states upon the application and removal of said write pulses to said first and second write wires, respectively.

8. The switch of claim 7, wherein said two or more write wires are two or more intersecting write wires.

9. The switch of claim 7, wherein said two or more write wires are two write wires.

10. The switch of claim 5, wherein said ferromagnet has a single easy axis of magnetization corresponding to said first magnetization state, and wherein a write wire is adapted for setting the magnetization state of said ferromagnet to said second magnetization state, and wherein the ferromagnet is adapted for switching to said second magnetization state in the presence of a writing pulse in said write wire, and switching to said first magnetization state in the absence of writing pulse in said write wire.

11. The switch of claim 5, wherein said ferromagnet has a single easy axis of magnetization corresponding to said second magnetization state, and wherein a write wire is adapted for setting the magnetization state of said ferromagnet to said first magnetization state, and wherein the ferromagnet is adapted for switching to said first magnetization state in the presence of a writing pulse in said write wire, and switching to said second magnetization state in the absence of writing pulse in said write wire.

12. The switch of claim 1, wherein said ferromagnet is adapted for having a continuous range of magnetization states, each of said range of magnetization states establishing a magnetic fringe field in said superconductive pathway, wherein said fringe fields have a continuous range, wherein said fringe fields suppress superconductivity in said superconductive pathway over a continuous range, thereby providing a tunable Josephson junction.

13. A method for changing the state of at least a portion of a superconductive pathway from superconducting to normal, comprising the step:

changing the magnetization state of a ferromagnet from a first magnetization state to a second magnetization state, wherein fringe fields from said ferromagnet in said first ferromagnetic state do not exceed a magnetic field in said superconductive pathway to convert said portion of said superconductive pathway to the normal state, and wherein fringe fields from said ferromagnet in said second ferromagnetic state exceed a magnetic field in said superconductive pathway to convert said portion of said superconductive pathway to the normal state.

14. A method for changing the state of at least a portion of a superconductive pathway from superconducting to normal, and subsequently changing said state of said portion from normal to superconducting, comprising the steps:

changing the magnetization state of a ferromagnet from a first magnetization state to a second magnetization state, wherein fringe fields from said ferromagnet in said first ferromagnetic state do not exceed a magnetic field in said superconductive pathway to convert said portion of said superconductive pathway to the normal state, and wherein fringe fields from said ferromagnet in said second ferromagnetic state exceed a magnetic field in said superconductive pathway to convert said portion of said superconductive pathway to the normal state; and changing said magnetization state of said ferromagnet from said second magnetization state to said first magnetization state, returning said portion of said superconductive pathway to said superconductive state.

15. A superconducting non-volatile memory element, comprising:

a pathway of a superconductive material;

a ferromagnet, wherein said ferromagnet is adapted for having at least a first magnetization state and a second magnetization state, wherein fringe fields from said ferromagnet in said first magnetization state do not exceed a predetermined magnetic field in said superconductive pathway to convert at least a portion of said superconductive pathway to the normal state, wherein fringe fields from said ferromagnet in said second magnetization state exceed said predetermined magnetic field in said superconductive pathway to convert at least a portion of said superconductive pathway to the normal state, wherein said ferromagnet is adapted for retaining magnetization states after the application and removal of a write pulse through a write wire;

a first write wire, adapted for setting said ferromagnet in said first magnetization state;

a second write wire, adapted for setting said ferromagnet in said second magnetization state; and a voltage detector, for reading a voltage across said superconductive pathway.

16. A superconducting voltage amplifier, comprising:

a pathway of a superconductive material;

a ferromagnet, wherein said ferromagnet is adapted for having at least a first magnetization state and a second magnetization state, wherein fringe fields from said ferromagnet in said first magnetization state do not exceed a predetermined magnetic field in said superconductive pathway to convert at least a portion of said superconductive pathway to the normal state, wherein fringe fields from said ferromagnet in said second magnetization state exceed said predetermined magnetic field in said superconductive pathway to convert at least a portion of said superconductive pathway to the normal state, wherein said ferromagnet is adapted for switching from said first magnetization state to said second magnetization state upon the application of a write pulse, and is further adapted for reverting to said first magnetization state upon the removal of said write pulse;

a write wire, adapted for applying a write pulse for setting said ferromagnet in said second magnetization state, thereby switching the state of said superconductive pathway from superconducting to at least partially normal; and a voltage detector, for reading a voltage across said superconductive pathway.

17. A switch, comprising:

means for superconductively carrying a current;

means for applying at least a first and a second magnetic field state to said superconductor means;

wherein fringe fields from said magnetic field state means in said first magnetic field state do not exceed a predetermined magnetic field in said superconductor means to convert at least a portion of said superconductor means to the normal state; and wherein fringe fields from said magnetic field state means in said second first magnetic field state exceed said predetermined magnetic field in said superconductor means to convert at least a portion of said superconductor means to the normal state.

18. A method for storing a bit in a superconductive memory element, comprising the steps:

assigning a first logical value to a first voltage state across a superconductive pathway;

assigning a second logical value to a second voltage state across a superconductive pathway; and orienting the magnetization of a ferromagnetic layer to either a first orientation or a second orientation, wherein said ferromagnetic layer is adapted for, in said first orientation, directing fringe fields from said ferromagnetic layer into said superconductive pathway to set said superconductive pathway to said first voltage state, and wherein said ferromagnetic layer is adapted for, in said second orientation, directing fringe fields from said ferromagnetic layer into said superconductive pathway to set said superconductive pathway to said second voltage state.

19. The method of claim 18, wherein said first voltage state corresponds to a finite voltage across said superconductive pathway, and wherein said second voltage state corresponds to an essentially zero voltage across said superconductive pathway.

20. The switch of claim 1, wherein said pathway of a superconductive material is a single pathway of a superconductive material.

21. The switch of claim 20, wherein said single pathway of a superconductive material is a monolithic pathway of a superconductive material.

22. The switch of claim 1, wherein a single surface of said ferromagnet faces said pathway of a superconductive material.

23. The switch of claim 1, wherein said ferromagnet overhangs said pathway of a superconductive material along an axis.

24. The switch of claim 1, further comprising an insulating layer interposed between said pathway of a superconductive material and said ferromagnet, for suppressing the proximity effect in said pathway of a superconductive material.

25. The switch of claim 24, wherein said insulating layer has an angstrom-scale thickness.

26. The method of claim 14, wherein said step of changing said magnetization state of said ferromagnet from said second magnetization state to said first magnetization state returns said portion of said superconductive pathway to said superconductive state without hysteresis in said superconductive pathway.

27. A method for reading a bit stored in a superconductive memory element, comprising:

assigning a first logical value to a first magnetization state in a ferromagnet, wherein fringe fields from said ferromagnet in said first magnetization state do not exceed a predetermined magnetic field in a superconductive pathway to convert at least a portion of said superconductive pathway to a state wherein said superconductive pathway sustains a preselected non-hysteretic voltage upon the application of a read current;

assigning a second logical value to a second magnetization state in said ferromagnet, wherein fringe fields from said ferromagnet in said first magnetization state do exceed a predetermined magnetic field in said superconductive pathway to convert at least a portion of said superconductive pathway to a state wherein said superconductive pathway sustains a preselected non-hysteretic voltage upon the application of said read current;

applying said read current to said superconductive pathway; and monitoring said superconductive pathway for said preselected non-hysteretic voltage.

* * * * *